United States Patent
Kim et al.

(10) Patent No.: US 9,301,400 B2
(45) Date of Patent: Mar. 29, 2016

(54) APPARATUS FOR USE IN FABRICATING TOUCH SCREEN PANEL

(71) Applicant: SAMSUNG DISPLAY CO., LTD., Yongin, Gyeonggi-Do (KR)

(72) Inventors: Young-Dae Kim, Yongin (KR); Byoung-Sang Song, Yongin (KR); Jong-Mo Yeo, Yongin (KR); Sang-Hoon Kim, Yongin (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 464 days.

(21) Appl. No.: 13/631,791

(22) Filed: Sep. 28, 2012

(65) Prior Publication Data

US 2013/0283610 A1 Oct. 31, 2013

(30) Foreign Application Priority Data

Apr. 26, 2012 (KR) ........................ 10-2012-0043832

(51) Int. Cl.
*B23P 19/00* (2006.01)
*H05K 13/04* (2006.01)
(Continued)

(52) U.S. Cl.
CPC .............. *H05K 3/1275* (2013.01); *G06F 3/041* (2013.01); *G06F 2203/04103* (2013.01); *H05K 2201/0108* (2013.01); *H05K 2201/0326* (2013.01); *H05K 2203/0534* (2013.01); *Y10T 29/49155* (2015.01); *Y10T 29/5313* (2015.01)

(58) Field of Classification Search
CPC .............. B41F 3/36; B41F 5/02; B41F 9/002; B41F 19/001; B41F 19/005; G03G 15/18; G03G 15/652; G03G 15/6552; G03F 7/002; G03F 7/0025; G03F 7/16; H05K 3/0002; H05K 3/0091; H05K 3/10; H05K 3/1258; H05K 3/1275; Y10T 29/49128; Y10T 29/49155; Y10T 29/49224; Y10T 29/53104; Y10T 29/5313; Y10T 29/53187
USPC ............. 29/592.1, 602.1, 831, 846, 849, 885, 29/724, 729, 742, 791; 101/154, 158, 163, 101/170, 483, 492
See application file for complete search history.

(56) References Cited

U.S. PATENT DOCUMENTS 4,201,801 A * 5/1980 Hori .............................. 427/274
4,282,810 A * 8/1981 Ellis ............................. 101/376
5,445,588 A * 8/1995 Ishibashi et al. ................ 492/31

(Continued)

FOREIGN PATENT DOCUMENTS

| KR | 10-2011-0004996 A | 1/2011 |
| KR | 10-2011-0098294 A | 9/2011 |
| KR | 10-2011-0118411 A | 10/2011 |

*Primary Examiner* — Paul D Kim
(74) *Attorney, Agent, or Firm* — Knobbe Martens Olson & Bear LLP (57) ABSTRACT

An apparatus and method for fabricating a touch screen panel is disclosed. The method includes forming material patterns on different areas of a blanket roll and printing the material patterns on a transparent substrate by rotating the blanket roll over the transparent substrate. An apparatus for fabricating a touch screen panel includes a blanket roll being rotatable about a rotational axis and configured to print a plurality of material patterns on a substrate while rotating over the substrate. A circumferential surface of the blanket roll includes circumferential areas that are angularly separate from each other about the rotational axis. Each of circumferential areas comprises a pattern for printing a component of a sensing cell to be formed on the substrate.

11 Claims, 5 Drawing Sheets

(51) Int. Cl.
*H05K 3/12* (2006.01)
*G06F 3/041* (2006.01)

(56) References Cited

U.S. PATENT DOCUMENTS

| | | | |
|---|---|---|---|
| 5,778,792 A * | 7/1998 | Lu | 101/483 |
| 7,377,215 B2 * | 5/2008 | Chen | 101/3.1 |
| 7,884,913 B2 * | 2/2011 | Kook et al. | 349/149 |
| 8,770,105 B2 * | 7/2014 | Moon et al. | 101/158 |
| 2007/0131307 A1 * | 6/2007 | Nien | 144/333 |
| 2010/0290143 A1 * | 11/2010 | Kim et al. | 359/891 |
| 2011/0005415 A1 | 1/2011 | Moon et al. | |
| 2012/0141665 A1 * | 6/2012 | Kim et al. | 427/97.5 |
| 2012/0227598 A1 * | 9/2012 | Miura | 101/154 |
| 2013/0031781 A1 * | 2/2013 | Lee et al. | 29/881 |
| 2013/0142947 A1 * | 6/2013 | Wu | 427/162 |
| 2014/0370714 A1 * | 12/2014 | Yoo et al. | 438/703 |

\* cited by examiner

APPARATUS FOR USE IN FABRICATING TOUCH SCREEN PANEL

CROSS-REFERENCE TO RELATED APPLICATION

This application claims priority to and the benefit of Korean Patent Application No. 10-2012-0043832, filed on Apr. 26, 2012, in the Korean Intellectual Property Office, the entire content of which is incorporated herein by reference.

BACKGROUND

1. Field

The present disclosure relates to a touch screen panel, and more particularly, to an apparatus and method of fabricating a touch screen panel.

2. Discussion of the Related Technology

A touch screen panel is an input device capable of receiving a user's instruction when a user touches an icon displayed on a screen of an image display device, or the like, with a human's hand or an object.

To this end, the touch screen panel is provided on a front surface of the image display device to an electric signal indicative of the position touched by the human hand or the object. Therefore, the icon or instruction content selected is recognized.

Since the touch screen panel can substitute a separate input device which needs to be connected to the image display device, such as a keyboard or a mouse, application fields thereof have been gradually extended.

A resistive type touch screen panel, a photosensitive type touch screen panel, a capacitive type touch screen type, and the like, have been known. Among them, the capacitive type touch screen panel senses change of capacitance between a conductive sensing pattern and neighboring sensing patterns or a ground electrode, or the like, when a human hand or an object contacts the touch screen panel, thereby an electric signal indicative of the contact position.

In order to fabricate the capacitive type touch screen panel, sensing patterns and conductive lines extending to terminal pad, insulating layers, and the like, should be formed on a substrate. Generally, the sensing patterns, the conductive lines, the insulating layers, and the like, can be formed using a photolithographic process.

That is, the sensing patterns, and the like, can be implemented by forming patterns through a photosensitive photo-resist. More specifically, the photosensitive photo-resist is applied to the substrate, light is irradiated through a mask, and a developing solution is then applied to form desired patterns. Therefore, in the case of forming sensing patterns, and the like, through the photolithographic process, a process can be complicated and a fabricating cost can be significantly high.

SUMMARY

An aspect of the present invention provides an apparatus and method of fabricating a touch screen panel capable of decreasing costs for a mask and the number of processes required in the existing photolithographic process. The method may comprises forming patterns of print solutions or materials for components such as sensing patterns, insulating patterns, and conductive lines on different areas on a single blanket roll and printing the components on a transparent substrate.

According to a embodiment of the present invention, an apparatus of fabricating a touch screen panel includes a substrate support configured to support a substrate thereon and a blanket roll being rotatable and movable and configured to rotate and move to print a plurality of material patterns on the substrate, wherein an outer surface of the blanket roll is divided into a plurality of areas separated from each other, and at least one of the plurality of material patterns is formed in each of the plurality of areas.

The plurality of material patterns may be different from one another in terms of their shape and material.

The apparatus may further comprise a gravure roll disposed having an outer surface on which pattern materials to be transferred to the blanket roll are applied, and a blanket roll driving unit configured to rotate and horizontally drive the blanket roll.

The outer surface of the gravure roll may be divided into areas, each of which corresponds to one of the pattern materials, and the apparatus may further comprise a plurality of dispensers configured to apply the plurality of pattern materials to the outer surface of the gravure roll.

The plurality of areas comprise first to third areas, the plurality of material patterns comprising first to third material patterns which are formed in the first to third areas, respectively.

The first material pattern may be configured to be printed in an active area of the substrate to form sensing cells and contain a transparent conductive material.

The second material pattern may be configured to be printed in the active area to form insulating layers, each of which is positioned between two neighboring sensing cells and contain an insulating material.

The third material pattern may be configured to be printed in the active area of the substrate to form first connecting lines, each of which electrically connects two neighboring sensing cells and further configured to be printed in the inactive area of the substrate to form conductive lines and contain a metal material.

According to another embodiment of the present invention, a method of fabricating a touch screen panel includes: printing a pattern of a first material formed in a first area of an outer surface of a blanket roll on an active area of a substrate by rotating and moving the blanket roll to form first and second sensing sells of the touch screen panel and second connecting lines, each of which electrically connects two neighboring second sensing cells; printing a pattern of a second material formed in a second area of the outer surface of the blanket roll on the active area of the substrate by rotating and moving the blanket roll to form island-shaped insulating layers overlapping with the second connecting lines; and printing a pattern of a third material formed in a third area of the outer surface of the blanket roll on the active and inactive areas of the substrate by rotating and moving the blanket roll to form first connecting lines, each of which electrically connects two neighboring first sensing cells and conductive lines in the inactive area which are electrically connected to the first and second sensing cells.

According to still another embodiment of the present invention, there is provided a method of fabricating a touch screen panel, including: forming a plurality of material patterns on an outer surface of a blanket roll divided into a plurality of areas separated from each other; and printing the plurality of material patterns on a substrate by rotating and moving the blanket roll.

At least one of the plurality of material patterns may be formed in each of the plurality of areas.

The plurality of areas may comprise first to third areas, and the plurality of material patterns may comprise first to third material patterns which are formed in the first to third areas, respectively.

The first material pattern may be printed in an active area of the substrate to form sensing cells and contain a transparent conductive material.

The second material pattern may be printed in the active area to form insulating layers, each of which is positioned between two neighboring sensing cells and contain an insulating material.

The third material pattern may be printed in the active area of the substrate to form first connecting lines, each of which connects two neighboring sensing cells and be printed in the inactive area of the substrate to form conductive lines and contain a metal material.

BRIEF DESCRIPTION OF THE DRAWINGS

The accompanying drawings, together with the specification, illustrate embodiments of the present invention, and, together with the description, serve to explain the principles of the present invention.

DETAILED DESCRIPTION OF EMBODIMENTS

In the following detailed description, only certain embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Hereinafter, embodiments of the present invention will be described in detail with reference to the accompanying drawings.

Figure 1:
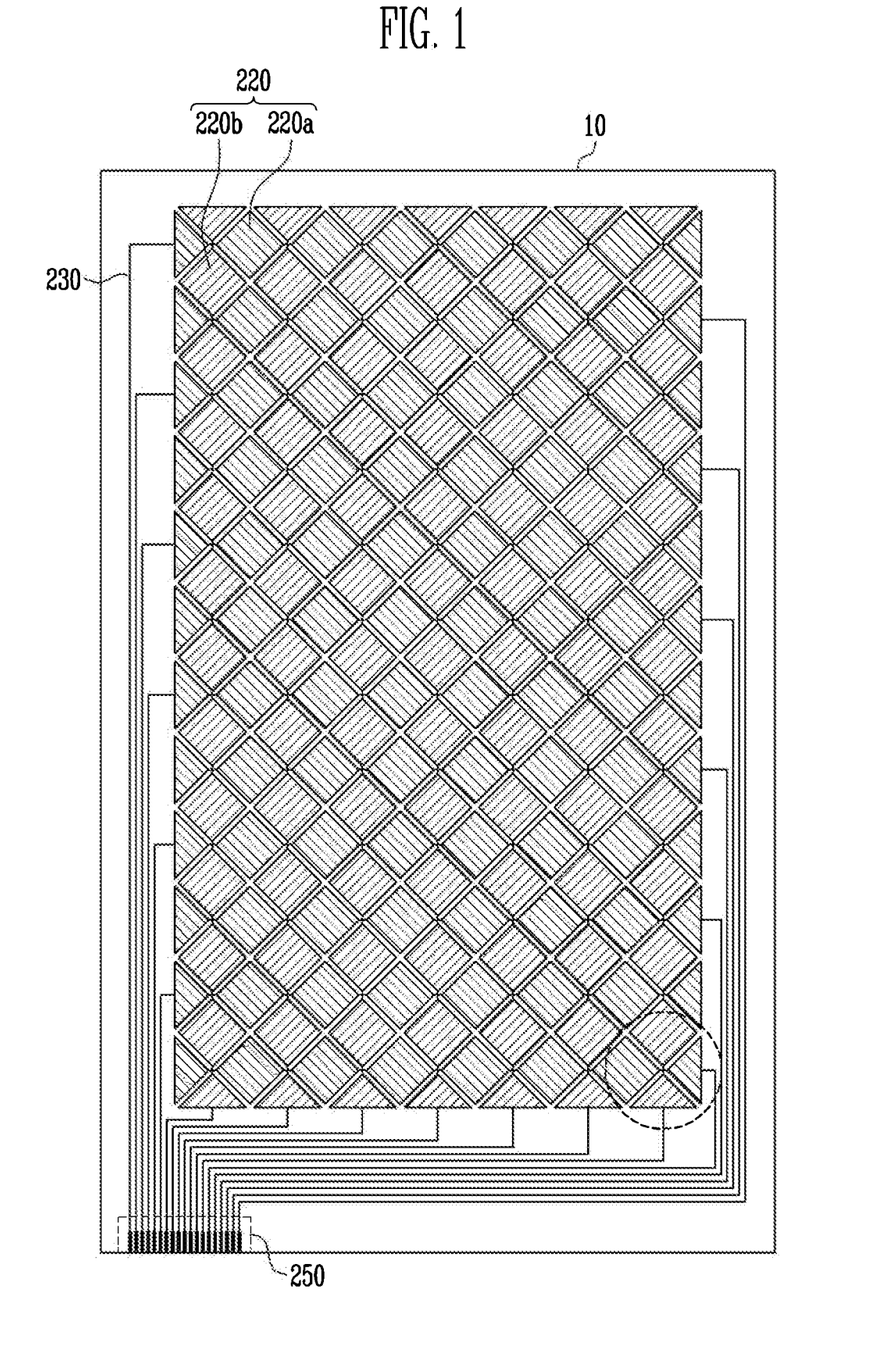
FIG. 1 is a plan view schematically showing an example of a touch screen panel fabricated according to an embodiment of the present invention.
Figure 2:
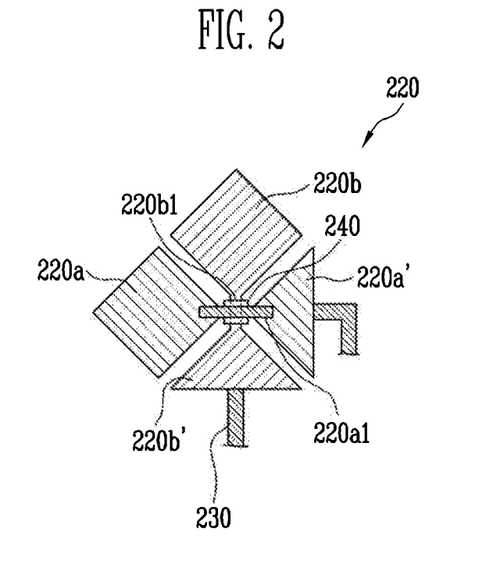
FIG. 2 is an enlarged view showing a part of an example of a sensing pattern shown in FIG. 1.

FIG. 1 is a plan view schematically showing an example of a touch screen panel fabricated according to an embodiment of the present invention, and FIG. 2 is an enlarged view showing a part of an example of a sensing pattern shown in FIG. 1.

However, in FIG. 2, a sensing pattern connected to a sensing or conductive line and positioned at a side of an active area among sensing patterns shown in FIG. 1 is shown for convenience.

Referring to FIG. 1 and FIG. 2, the touch screen panel according to embodiments of the present invention is configured to include: sensing patterns 220 formed in an active area of a transparent substrate 10 and sensing or conductive lines 230 formed in an inactive region of the transparent substrate 10 and connecting the sensing patterns 220 to an external driving circuit (not shown) through a pad unit 250.

The configuration of the touch screen panel according to embodiments of the present invention will be described below.

First, as shown in FIG. 2, the sensing patterns 220 includes a plurality of first sensing cells 220a formed to be connected in a row direction for forming each row line, first connecting lines 220a1 connecting the first sensing cells 220a to one another in the row direction, second sensing cells 220b formed to be connected in a column direction for forming each column line, and a second connecting lines 220b1 connecting the second sensing cells 220b to one another in the column direction.

In embodiments, a sensing cell 220a' among the first sensing cell 220a is positioned at a the right side of the active area, implemented in a triangular shape and electrically connected to the sensing line 230 formed in the inactive area.

Likewise, a sensing cell 220b' among the second sensing cells 220b is positioned at a bottom end of the right of the active area, implemented in a triangular shape and electrically connected to the sensing line 230 formed in the inactive area.

However, the first and second sensing cells 220a and 220b other than sensing cells 220a' and 220b' formed at the top, bottom, right and left sides of the active region are implemented in a diamond shape.

The first and second sensing cells 220a and 220b are alternatively disposed so as not to be overlapped with each other, and the first and second connecting lines 220a1 and 220b1 intersect with each other. Here, an island-shaped insulating layer 240 is interposed between the first and second connecting lines 220a1 and 220b1 in order to provide insulation between two connecting lines and stability.

In embodiments, the first and second sensing cells 220a and 220b may be formed integrally with the first and second connecting lines 220a1 and 220b1 using a transparent conductive material such as indium tin oxide (ITO), or be formed separately from the first and second connecting lines 220a1 and 220b1 and then electrically connected to one another by forming the first and second connecting lines 220a1 and 220b1.

In embodiments, the second sensing cells 220b may be formed integrally with the second connection lines 220b1 in the column direction, and the first sensing cells 220a may be patterned between the second sensing cells 220b so as to each have an independent pattern and be connected to each other by the first connecting lines 220a1 in the row direction.

According to embodiments of the present invention illustrated in the drawings, the first connecting lines 220a1 are formed on the island-shaped insulating layer 240 to connect first sensing cells 220a to one another. However, the present invention is not necessarily limited thereto.

In embodiments, each of the first connecting lines 220a1 may directly contact two immediately neighboring cells among the first sensing cells 220a at an upper or lower portion of the two immediately neighboring first sensing cells 220a to thereby electrically connect them. In other embodiments, each of the first connecting lines may be electrically connected to the first sensing cells 220a through contact holes, or the like, formed through an insulating layer (not shown) formed throughout the substrate.

Further, the first connecting lines 220a1 may be made of a transparent conductive material such as ITO or be made of an opaque low resistance metal material, and have an adjusted width, or the like, in order to prevent visualization of the pattern.

However, the case in which the first connecting lines 220a1 are made of the same material as that of the sensing lines 230 is described by way of example in embodiments of the present invention.

The sensing lines 230 are connected to the first sensing cells 220a in a row unit and the second sensing cells 220b in a column unit to connect the first and second cells 220a and 220b to the external driving circuit (not shown) such as a position detecting circuit through the pad unit 250.

These sensing lines 230, which are disposed in the inactive area that corresponds to the outside of the active area in which an image is displayed, may be made of a wide range of materials. That is, the sensing lines 230 may be made of a low resistance metal material such as molybdenum (Mo), silver (Ag), titanium (Ti), copper (Cu), aluminum (Al), molybdenum/aluminum/molybdenum (Mo/Al/Mo), and the like, in addition to the transparent conductive material used to form the sensing patterns 220.

The touch screen panel according to embodiments of the present invention as described above is a capacitive type touch panel. When a contact object such as a human hand, a stylus pen, or the like, contacts the touch panel, capacitance change at the contact position is transferred from the sensing patterns 220 to the driving circuit (not shown) via the sensing lines 230 and the pad unit 250. In this case, the change in capacitance is converted into an electrical signal by an X and Y input processing circuits (not shown), or the like, such that the contact position is recognized.

According to an comparative example, the photolithography process can be used in order to fabricate the touch screen panel shown in FIGS. 1 and 2. However, as described above, in the case of forming sensing patterns, and the like, through the photolithographic process, a process is complicated and a fabricating cost is significantly high.

In another comparative example, a method of fabricating the sensing patterns, and the like, in a printing scheme is introduced. However, in the case in which an existing printing scheme is used, the sensing patterns, the sensing lines, and the insulating layers are formed through different steps or processes, respectively, which is troublesome.

Therefore, according to embodiments of the present invention, components of the sensing patterns, the insulating layers, and the sensing lines are formed on the transparent substrate in an offset printing scheme. In embodiments, print solutions (which can also be referred to as printing materials, printing compositions, or materials to be applied) are implemented as materials for forming the respective components are formed in different areas particularly on an outer surface of a blanket roll, thereby making it possible to reduce costs required for a mask and the number of processes of the existing photolithographic process.

An apparatus and method of fabricating a touch screen panel according to embodiments of the present invention will be described in more detail.

A target of the apparatus of fabricating a touch screen panel according to embodiments of the present invention is a printing apparatus forming the components such as sensing patterns, and the like, included in the touch screen panel. Here, although a printing method using the printing apparatus may be implemented in various schemes, a fabricating apparatus and method of implementing an offset printing process will be described as by way of example in embodiments of the present invention.

In embodiments, the offset printing process includes forming pattern materials as patterned, printing materials on the outer surface of the blanket roll and subsequently transferring the pattern materials to the substrate. The blanket serves as an intermediating apparatus which is used rather than printing the pattern materials directly on the substrate, such that electrodes are printed to have a more accurate width, thereby making it possible to obtain more definite image quality.

However, this is only an example, and embodiments of the present invention is not necessarily limited thereto.

Figure 3A:
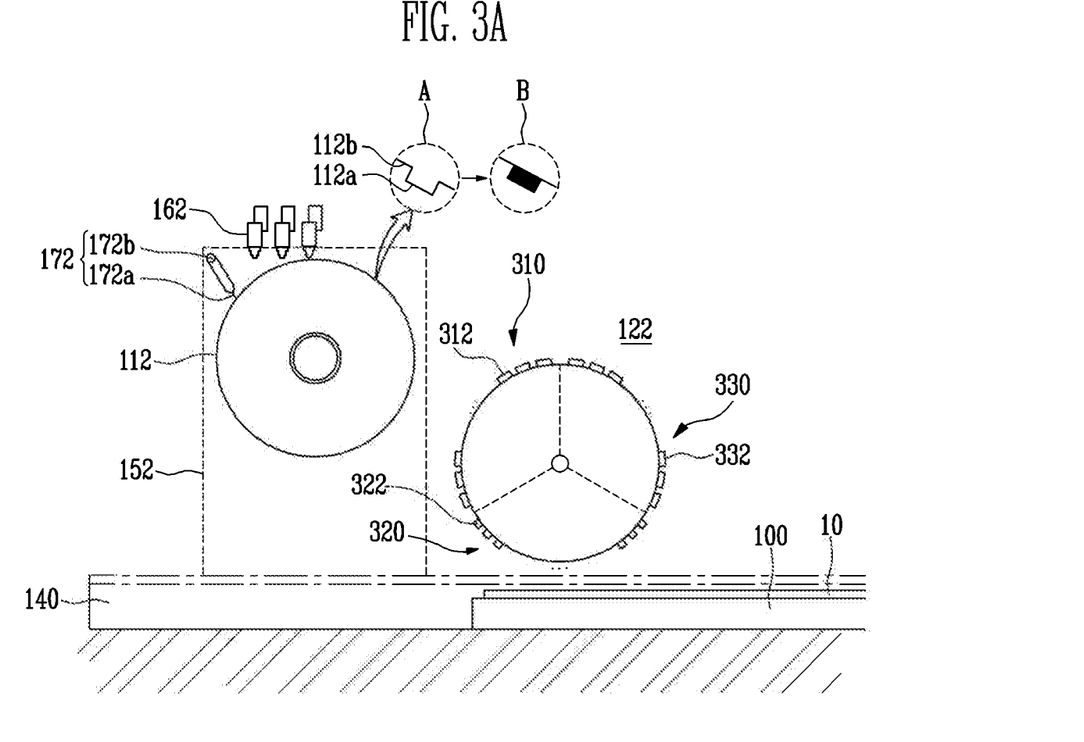
FIGS. 3A and 3B are views showing a schematic configuration of an apparatus of fabricating a touch screen panel according to embodiments of the present invention.
Figure 3B:
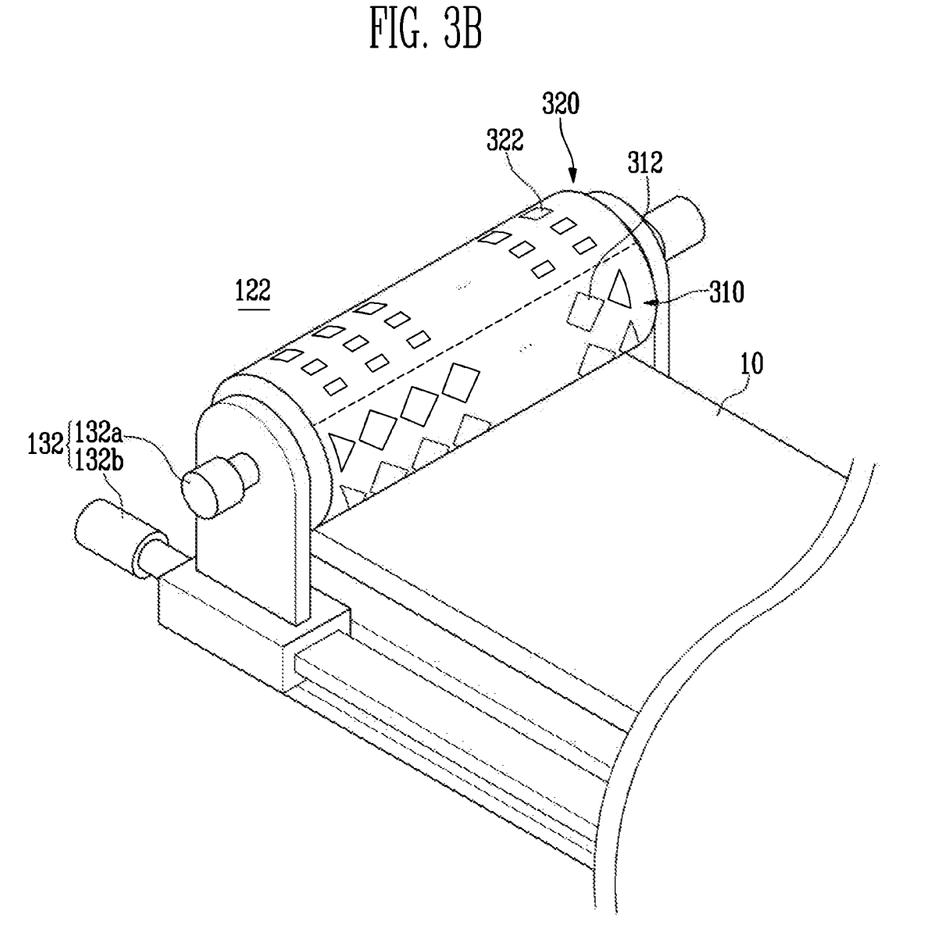

FIGS. 3A and 3B are views showing a schematic configuration of an apparatus of a fabricating touch screen panel according to embodiments of the present invention.

Referring to FIGS. 3A and 3B, the apparatus of fabricating a touch screen panel according to embodiments of the present invention is implemented as a gravure offset printing apparatus. The gravure offset printing apparatus includes a substrate support 110 supporting a substrate 10 thereon, a gravure roll 112 disposed at or adjacent one end of the substrate support 100 and having materials applied to an outer surface thereof, a blanket roll 122 provided so as to be capable of approaching and becoming distant from the gravure roll 112 and receiving the materials from the gravure roll 112 to re-transfer the materials to the substrate on the substrate support 110, and a blanket roll driving unit 132 rotating and horizontally driving the blanket roll 122.

The gravure roll 112 serves to transfer the respective materials corresponding to the sensing patterns, the insulating layers, and the sensing lines shown in FIG. 1 and FIG. 2, which are materials for printing, to different areas on the outer surface of the blanket roll 122.

According to embodiments of the present invention, a transparent conductive material corresponding to the sensing patterns, an insulating material corresponding to the insulating layers, and a metal material corresponding to the sensing lines are implemented as different materials.

In embodiments, the gravure roll 112 and the blanket roll 122 have substantially the same volume. The gravure roll 112 may rotate at a corresponding position by a gravure roll driving unit (not shown) coupled to a supporting unit 152 fixed to and stood-up at each of both ends of a lower base 140. The gravure roll 112 may be coupled directly to the gravure roll driving unit, or be coupled to the gravure roll driving unit through a separate pocket (not shown). In the case in which the pocket is provided, the gravure roll 112 may be easily replaced, and eccentricity and the horizontal axis line of the gravure roll 112 may be easily adjusted.

Dispensers 162 applying the materials to the outer surface of the gravure roll 112 apply each of materials corresponding to the sensing patterns, the insulating layers, and the sensing lines of the touch screen panel described above to the outer surface of the gravure roll 112. Therefore, according to embodiments of the present invention, the number of dispensers is three so as to correspond to that of the materials.

Meanwhile, the outer surface of the gravure roll 112 is divided into three areas corresponding to the number of materials, and at least one different prominence-depression pattern is formed in each area as shown in the enlarged portion A of FIG. 3A. Here, the prominence-depression pattern may have a relief shape or intaglio shape. When the pattern has the relief shape, the material is applied to an outer surface of a prominent portion (not shown) of the prominence-depression to thereby be transferred to the blanket roll 122. When the pattern has the intaglio shape, the material is applied to an inner portion of a depressed portion 112a to thereby be transferred to the blanket roll 122.

However, it may be advantageous that the prominence-depression pattern formed on the outer surface of the gravure roll 112 has the intaglio shape in order to keep the thickness of the material pattern uniform when blanket roll 122 forms the material patterns by receiving the material transferred from the outer surface of the gravure roll 112 and retransferring (printing) the material to the substrate 10.

When each of three different materials is applied to the corresponding outer surface among the three areas of the gravure roll 112 separated from each other by the dispensers 162, the material need to be substantially applied only to the depressed portion 112a as shown in an enlarged portion B of FIG. 3A. However, when the dispensers 162 apply the materials to the outer surface of the gravure roll 112, it is difficult to apply the materials at a time such that the materials are selectively received only in the depressed portion 112a of the intaglio shape.

Therefore, the dispensers 162 apply the materials so as to be widely spread over the entire outer surface of the gravure roll 112 when they apply the materials to the outer surface of the gravure roll 112 and remove unnecessary materials applied to a surface 112b with the exception of the depressed portion 112a having the intaglio shape after the application is completed, thereby making it possible to allow the materials to be received only in the depressed portion. To this end, a doctor blade 172 is provided around the gravure roll 112 in order to remove the unnecessary materials.

The doctor blade 172 includes a knife holder 172b and a knife 172a coupled to the knife holder 172b, wherein the knife 172a is disposed in parallel with a length direction of the gravure roll 112 to remove the material while contacting (the knife 172 may be actually spaced apart from the surface of the gravure roll 112 by a slight interval) the surface of the gravure roll 112 rotating in the state in which the materials are applied.

As described above, since the front end of the knife 172a contacts the outer surface of the gravure roll 112, when the materials are applied to the rotating outer surface of the rotating gravure roll 112, the materials applied to the surface 112b with the exception of the depressed portion 112a having the intaglio shape may be naturally removed by the knife 172a. As a result, the materials may be received only in the depressed portion 112a as shown in the enlarged portion B of FIG. 3A.

Further, the blanket roll 122 according to embodiments of the present invention receives the material pattern formed on the region of the outer surface corresponding to each of three areas of the gravure roll 112 separated from each other and then moves to the substrate support 100 to substantially serve to print each material pattern on the substrate.

That is, the illustrated embodiment of the present invention is implemented so that the outer surface of one blanket roll is divided into a plurality of areas and the material pattern corresponding to each component is transferred to each area.

Therefore, as shown in FIG. 3A, the outer surface of the blanket roll 122 according to embodiments of the present invention is divided into three different areas 310, 320, 330, wherein a first material pattern 312 containing a transparent conductive material for forming the sensing patterns are transferred to a first area 310, a second material pattern 322 containing an insulating material for forming the insulating layers are transferred to a second area 320, and a third material pattern 332 containing a metal material corresponding to the sensing lines are transferred to a third area 330.

In embodiments, the blanket roll 122 is capable of approaching and becoming distant from the gravure roll 112, and rotating on the upper surface of the substrate 10 loaded on the substrate support 100. To this end, both sides of the blanket roll 122 are provided with the blanket roll driving unit 132 so as to move the blanket roll 122 on a side rail R of the lower base 140 in the horizontal direction and rotate the blanket roll 122 at a corresponding position, as shown in FIG. 3B. The blanket roll driving unit 132 rotates and horizontally drives the blanket roll 122 so as to print a plurality of different material patterns transferred from the gravure roll 112 on the substrate as they are. Therefore, according to embodiments of the present invention, the blanket roll driving unit includes a rotational driving unit 132a and a horizontal driving unit 132b.

With the apparatus according to embodiments of the present invention shown in FIG. 3A and FIG. 3B, in forming components such as the sensing patterns, the insulating layers, and the sensing lines on the substrate in the offset printing scheme, print solutions (printing materials) corresponding to the materials corresponding to the respective components are formed in three different areas 310, 320, 330 of a single blanket roll 112, thereby making it possible to reduce a cost required for a mask and the number of processes compared to the existing photolithographic process. A method of fabricating a touch screen panel according to embodiments of the present invention will be described below in more detail.

Figure 4A:
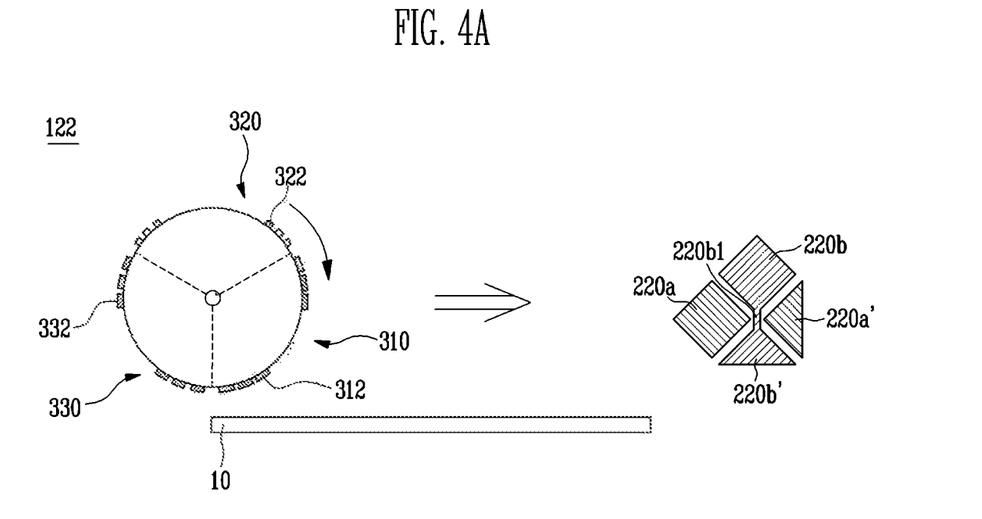
FIGS. 4A to 4C are views showing a method of fabricating a touch screen panel according to embodiments of the present invention.
Figure 4B:
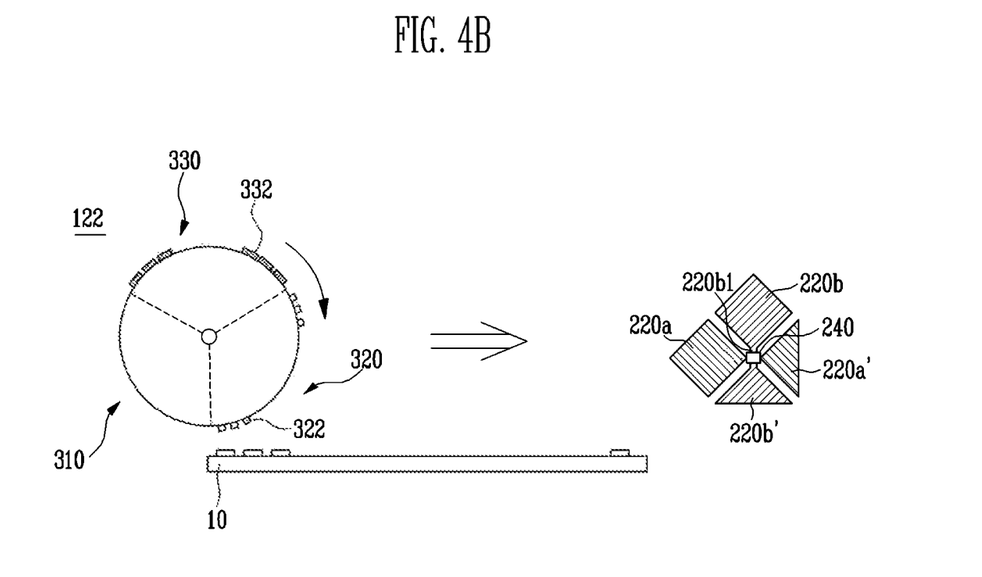
Figure 4C:
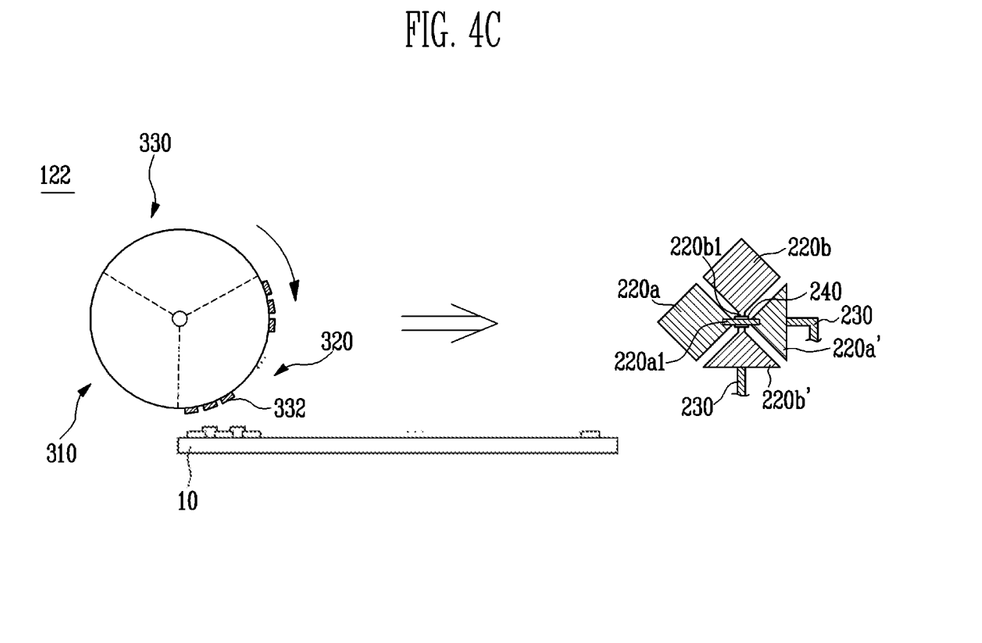

FIGS. 4A to 4C are views showing a method of fabricating a touch screen panel according to embodiments of the present invention.

However, in order to allow embodiments to be easily understood, components of the touch screen panel formed corresponding to each step of the method of fabricating according to embodiments of the present invention will be described with reference to areas shown in FIG. 2.

First, referring to FIGS. 3 to 4A, the first material pattern 312 formed in the first area 310 of the outer surface of the blanket roll 122 are printed in the active area of the substrate 10 by rotating and moving the blanket roll 122.

That is, referring to an enlarged plan view of a partial area of the touch screen panel shown in FIG. 4A, the first material pattern 312 corresponds to the first sensing cells 220a, 220a' of the touch screen panel, the second sensing cells 220b, 220b' disposed alternately with the first sensing cells 220a and 220a' so as not to be overlapped with the first sensing cells 220a and 220a', and the second connecting lines 220b1 connecting the second cells 220b to each other in the row direction.

After the first and second sensing cells and the second connecting lines are formed by printing the first material pattern 312, the second material pattern 322 formed in the second area 320 of the outer surface of the blanket roll 122 are printed in the active area of the substrate 10 by rotating and moving the blanket roll 122, as shown in FIG. 4B.

That is, referring to an enlarged plan view of a partial area of the touch screen panel shown in FIG. 4B, the second material pattern 322 corresponds to the insulating layers 240 formed in an island shape on the area at least partly overlapping with the second connecting lines 220b1.

Finally, after the insulating layers having the island shape are formed on the area overlapped with the second connecting lines by printing the second material pattern 322, the third material pattern 332 formed in the third area 330 of the outer surface of the blanket roll 122 are printed in the active area and the inactive area of the substrate 10 by rotating and moving the blanket roll 122, as shown in FIG. 4C.

That is, referring to an enlarged plan view of a partial area of the touch screen panel shown in FIG. 4C, the third material pattern 332 corresponds to the first connecting lines 220a1 electrically connecting adjacent first sensing cells to each other and sensing lines 330 formed in the inactive area and connected to the first sensing sells 220a1 in the row unit and the second sensing cells 220b' in the column unit.

As described above, according to embodiments of the present invention, a single blanket roll 122 is used thereby making it possible to simultaneously form sensing patterns 220, the insulating layers 240, and sensing lines 230.

As set forth above, according to embodiments of the invention, an apparatus and method of fabricating a touch screen panel are provided by forming each of print solutions corresponding to materials corresponding to components such as sensing patterns, insulating patterns, and sensing lines on different areas on a single blanket roll in forming the components on a transparent substrate in the offset printing scheme, thereby making it possible to reduce a cost required for a mask and the number of processes compared to the existing photolithographic process.

While embodiments of the present invention has been described, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An apparatus for use in fabricating a touch screen panel, the apparatus comprising:
   a substrate support configured to support a substrate thereon; and
   a blanket roll being rotatable about a rotational axis and movable and comprising a plurality of printing patterns on a circumferential surface, the blanket roll configured to print a plurality of material patterns on the substrate while rotating over the substrate,
   wherein the circumferential surface of the blanket roll comprises
   a first circumferential area, a second circumferential area and a third circumferential area arranged in sequence along a circumferential direction about the rotational axis,
   wherein the first circumferential area comprises a first pattern for printing a first conductive component over the substrate,
   wherein the second circumferential area comprises a second pattern for printing an insulating component over at least part of the first conductive component,
   wherein the third circumferential area comprises a third pattern for printing a second conductive component over at least part of the insulating component.

2. The apparatus of claim 1, wherein the plurality of material patterns are different from one another in terms of their shape and material.

3. The apparatus of claim 1, further comprising:
   a gravure roll comprising an outer surface configured to transfer pattern materials to the blanket roll; and
   a blanket roll driving unit configured to rotate and horizontally move the blanket roll.

4. The apparatus of claim 3, wherein the outer surface of the gravure roll comprises a first outer surface area corresponding to the first circumferential area and a second outer surface area corresponding to the second circumferential area.

5. The apparatus of claim 3, further comprising:
   a plurality of dispensers configured to apply printing materials to the outer surface of the gravure roll.

6. The apparatus of claim 1, wherein the plurality of circumferential areas further comprise a third circumferential area, wherein the plurality of material patterns further comprise a third material patterns which is formed in the third circumferential area.

7. The apparatus of claim 1, wherein the first pattern contains a transparent conductive material.

8. An apparatus for use in fabricating a touch screen panel, the apparatus comprising:
   a substrate support configured to support a substrate thereon; and
   a blanket roll being rotatable and movable and configured to rotate and move to print a plurality of material patterns on the substrate,
   wherein an outer surface of the blanket roll is divided into a plurality of areas separated from each other, and at least one of the plurality of material patterns is formed in each of the plurality of areas,
   wherein the plurality of areas comprise first to third areas, the plurality of material patterns comprising first to third material patterns which are formed in the first to third areas, respectively,
   wherein the first material pattern is configured to be printed in an active area of the substrate to form sensing cells,
   wherein the second material pattern is configured to be printed in the active area to form insulating layers, each of which is positioned between two neighboring cells of the sensing cells.

9. The apparatus of claim 8, wherein the third material pattern is configured to be printed in the active area of the substrate to connecting lines, each of which electrically connects two neighboring cells of the sensing cells and further configured to be printed in the inactive area of the substrate to form conductor lines.

10. The apparatus of claim 9, wherein the third material pattern contains a metal material.

11. An apparatus for use in fabricating a touch screen panel, the apparatus comprising:
   a substrate support configured to support a substrate thereon; and
   a blanket roll being rotatable and movable and configured to rotate and move to print a plurality of material patterns on the substrate,
   wherein an outer surface of the blanket roll is divided into a plurality of areas separated from each other, and at least one of the plurality of material patterns is formed in each of the plurality of areas,
   wherein the plurality of areas comprise first to third areas, the plurality of material patterns comprising first to third material patterns which are formed in the first to third areas, respectively,
   wherein the first material pattern is configured to be printed in an active area of the substrate to form sensing cells,
   wherein the second material pattern contains an insulating material.

* * * * *